United States Patent
Jun et al.

(10) Patent No.: US 9,496,335 B2
(45) Date of Patent: Nov. 15, 2016

(54) SUPER JUNCTION SEMICONDUCTOR DEVICE AND METHOD FOR MANUFACTURING THE SAME

(71) Applicant: MagnaChip Semiconductor, Ltd., Cheongju-si (KR)

(72) Inventors: Kwang Yeon Jun, Bucheon-si (KR); Chang Yong Choi, Seoul (KR); Hyuk Woo, Incheon-si (KR); Moon Soo Cho, Seoul (KR); Soon Tak Kwon, Seongnam-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/882,606

(22) Filed: Oct. 14, 2015

(65) Prior Publication Data

US 2016/0035825 A1 Feb. 4, 2016

Related U.S. Application Data

(62) Division of application No. 14/242,359, filed on Apr. 1, 2014, now Pat. No. 9,190,469.

(30) Foreign Application Priority Data

Sep. 17, 2013 (KR) .................. 10-2013-0111887

(51) Int. Cl.
*H01L 29/06* (2006.01)
*H01L 21/265* (2006.01)
*H01L 29/66* (2006.01)
*H01L 29/78* (2006.01)
(Continued)

(52) U.S. Cl.
CPC ......... *H01L 29/0634* (2013.01); *H01L 21/265* (2013.01); *H01L 21/26513* (2013.01); *H01L 29/0878* (2013.01); *H01L 29/1095* (2013.01); *H01L 29/66712* (2013.01); *H01L 29/7802* (2013.01)

(58) Field of Classification Search
CPC .............. H01L 29/0634; H01L 21/265; H01L 29/66712; H01L 29/7802; H01L 21/26513; H01L 29/0878; H01L 29/1095
See application file for complete search history.

(56) References Cited

U.S. PATENT DOCUMENTS

| 6,300,171 B1 | 10/2001 | Frisina |
| 7,345,342 B2 | 3/2008 | Challa et al. |
| 2006/0284248 A1 | 12/2006 | Saito et al. |

(Continued)

FOREIGN PATENT DOCUMENTS

| JP | 09-283535 A | 10/1997 |
| JP | 10-74939 A | 3/1998 |
| WO | WO 03/034500 A2 | 4/2003 |

*Primary Examiner* — Long Pham

(57) ABSTRACT

There is provided a super junction semiconductor device and a method of manufacturing the same. A super junction semiconductor device includes an n-type semiconductor region disposed in a substrate, two or more p-type semiconductor regions disposed adjacent to the n-type semiconductor region alternately in a direction parallel to a surface of the substrate, a p-type body region disposed on at least one of the p-type semiconductor regions, and a source region disposed in the p-type body region, and an n-type ion implantation region is formed along a lower end of the n-type semiconductor region and lower ends of the p-type semiconductor regions.

7 Claims, 15 Drawing Sheets

(51) Int. Cl.
*H01L 29/08* (2006.01)
*H01L 29/10* (2006.01)

(56) References Cited

U.S. PATENT DOCUMENTS

2008/0150073 A1   6/2008  Willmeroth et al.
2008/0246079 A1  10/2008  Saito et al.
2009/0273031 A1  11/2009  Saito et al.
2012/0032255 A1   2/2012  Willmeroth et al.

SUPER JUNCTION SEMICONDUCTOR DEVICE AND METHOD FOR MANUFACTURING THE SAME

CROSS-REFERENCE TO RELATED APPLICATIONS

This application is a divisional of U.S. patent application Ser. No. 14/242,359, filed Apr. 1, 2014, which claims the benefit under 35 USC 119(a) of Korean Patent Application No. 10-2013-0111887 filed on Sep. 17, 2013, in the Korean Intellectual Property Office, the entire disclosure of which is incorporated herein by reference for all purposes.

BACKGROUND

1. Field

The following description relates to a semiconductor device and a method for manufacturing the same, and, for example, to a semiconductor device having a super junction structure and a method for manufacturing the same.

2. Description of Related Art

High-voltage and high-power devices are often used in power integrated circuit (IC) apparatuses for power conversion and in power control systems. A planar gate metal oxide semiconductor field effect transistor (MOSFET) is widely used as such a high-voltage device.

However, in a planar gate MOSFET, in order to maintain the distribution of electric field in its epitaxial region, a certain minimal thickness needs to be maintained in the epitaxial region, and the epitaxial region needs to have a certain minimal concentration of dopants. Thus, due to the relationship between the electric field distribution and the thickness and dopant concentration, it is difficult to obtain a MOSFET that has less than a certain resistance component. In order to solve this limitation, a super junction structure has been suggested.

The conventional super junction semiconductor device comprises components that bear some resemblance to a gate and a p-type well structure of a general MOSFET. However, the p-type pillar region for obtaining super junction characteristics is formed in an n-type pillar region at a lower end of a p-type body region. The difference in structure results in the following effect. In a general MOSFET, a depletion layer extends only in a vertical direction when a voltage is applied to its drain. In a super junction semiconductor device, a depletion layer extends in both a vertical direction and a horizontal direction when a voltage is applied to its drain. In such a device, when the quantities of charge in both regions are the same, as the n-type and p-type regions are depleted, a high breakdown voltage can be obtained. Since charge does not exist in the vertical direction, an electric field in the vertical direction is constantly generated in theory.

However, the conventional semiconductor device having the super junction structure has a problem in that, because a resistance of a drift region near a drain region is relatively higher than that of a drift region near a source region, high current density is not obtained at the time of being turned on.
Patent Literature: U.S. Pat. No. 7,345,342

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a super junction semiconductor device including an n-type semiconductor region disposed in a substrate, two or more p-type semiconductor regions disposed adjacent to the n-type semiconductor region alternately in a direction parallel to a surface of the substrate, a p-type body region disposed on at least one of the p-type semiconductor regions, and a source region disposed in the p-type body region, in which an n-type ion implantation region is formed along a lower end of the n-type semiconductor region and lower ends of the p-type semiconductor regions.

The general aspect of the super junction semiconductor device may further include a drain electrode electrically connected to the substrate, and a source electrode disposed on the p-type body region and the source region.

A net quantity of charge of the n-type semiconductor region and a quantity of charges of the p-type semiconductor region may be balanced.

A lower region of the p-type semiconductor regions in a vertical direction may have the lowest p-type doping concentration in the p-type semiconductor regions.

A lower region of the n-type semiconductor region in a vertical direction may have a doping concentration higher than a doping concentration of an upper region of the n-type semiconductor region.

The p-type semiconductor regions may include a first region disposed at a lower end and a second region disposed at an upper end, and the first region and the second region may have different widths.

The width of the first region at the lower end may be smaller than the width of the second region at the upper end.

The doping concentration of the n-type semiconductor region may be constant above the lower end of the n-type semiconductor region having the smaller width.

In another general aspect, there is provided a semiconductor device including a drain region, a n-type semiconductor region disposed above the drain region, two or more p-type semiconductor regions disposed alternately to the n-type semiconductor region in a direction parallel to the drain region, and a source region disposed above the p-type semiconductor region, in which a width of the n-type semiconductor region adjacent to the drain region is larger than a width of the n-type semiconductor region adjacent to the source region, and a width of the p-type semiconductor region adjacent to the drain region is smaller than a width of the n-type semiconductor region adjacent to the source region.

A doping concentration of the n-type semiconductor region adjacent to the drain region may be higher than a doping concentration of the n-type semiconductor region adjacent to the source region, and a doping concentration of each of the p-type semiconductor regions adjacent to the drain region may be lower than a doping concentration of the n-type semiconductor region adjacent to the source region.

In another general aspect, there is provided a method of forming a super junction semiconductor device, the method involving forming a first epitaxial layer of first conductivity type above a substrate, forming first pillar regions of second conductivity type by doping two or more areas of the first epitaxial layer with a second conductivity type dopant, and forming an ion implantation region by doping the first pillar regions and the first epitaxial layer with a first conductivity type dopant, and forming a second epitaxial layer and second pillar regions above the first epitaxial layer and the first pillar regions.

One or more additional epitaxial layer and additional pillar regions may be formed above the second epitaxial layer and the second pillar regions, such that the first pillar regions, the second pillar regions and the one or more additional pillar regions are aligned to form two or more second conductivity type pillar structures adjacent to a first conductivity type pillar structure, and the general aspect of the method may further involve forming a body region and source region above the two or more second conductivity type pillar structures.

The general aspect of the method may further involve forming a source electrode on the body region and the source region, forming a gate electrode between the two or more second conductivity type pillar structures, and forming a drain electrode below the substrate.

A lower end of the second conductivity type pillar structures may have a smaller width than an upper end of the second conductivity type pillar structures.

The lower end of the second conductivity type pillar structures may correspond to a junction field effect (JFET) ion implantation region in which counter-doping is performed.

In the general aspect of the method, counter-doping may be not performed on the second pillar regions and the additional pillar regions formed above the second pillar regions.

A dopant concentration of the first epitaxial layer between the two or more first pillar regions may be higher than a net dopant concentration of the two or more first pillar regions after forming the ion implantation region.

Other features and aspects will be apparent from the following detailed description, the drawings, and the claims.

Figure 1:
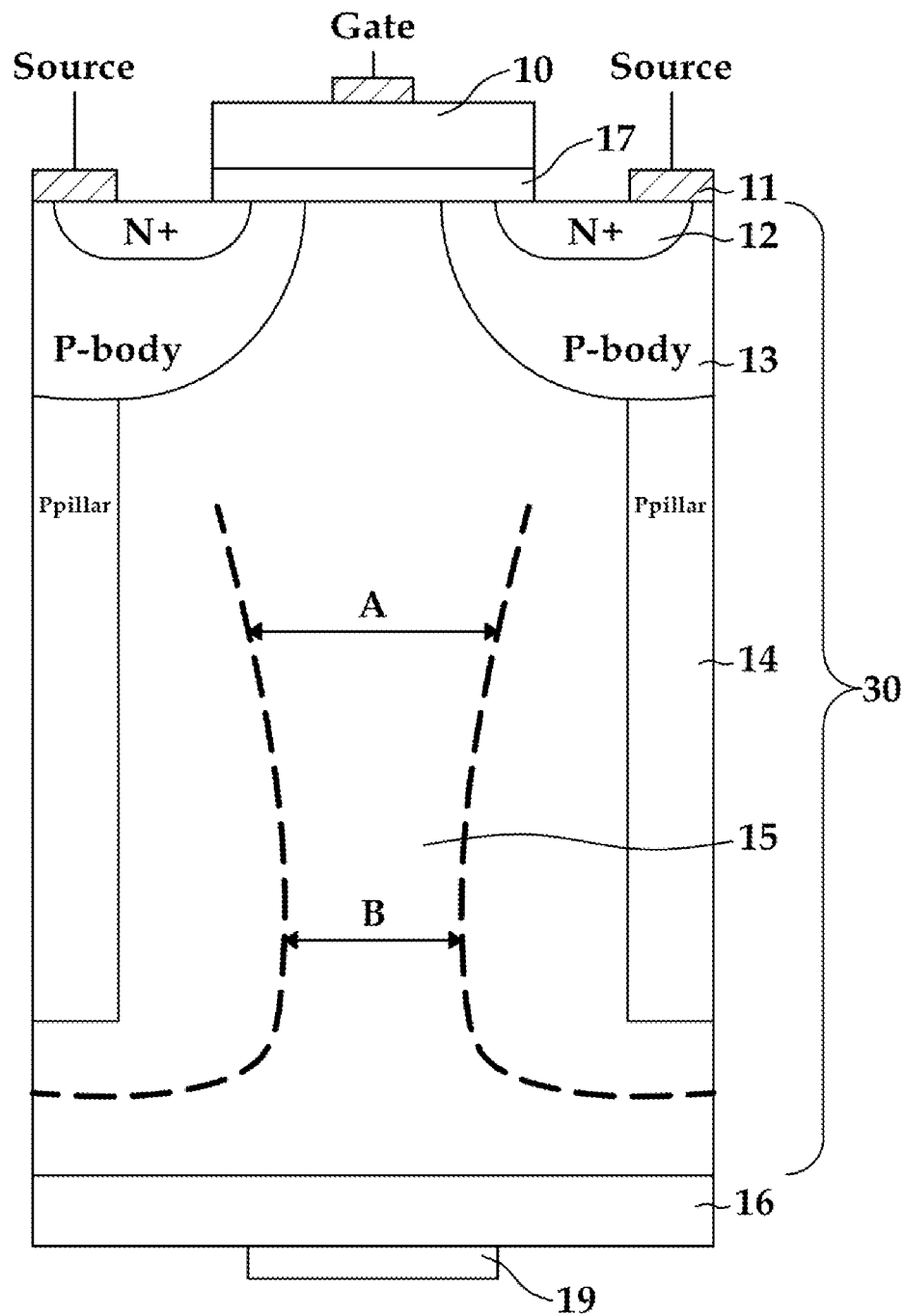
FIG. 1 illustrates a cross-sectional view of an example of a super junction semiconductor device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

The spatially-relative expressions such as "below", "beneath", "lower", "above", "upper", and the like may be used to conveniently describe relationships of one device or elements with other devices or among elements. The spatially-relative expressions should be understood as encompassing the direction illustrated in the drawings, added with other directions of the device in use or operation. Further, the device may be oriented to other directions and accordingly, the interpretation of the spatially-relative expressions is based on the orientation.

The expression such as "first conductivity type" and "second conductivity type" as used herein may refer to the conductivity types such as N or P types which are opposed to each other, and an example explained and exemplified herein encompasses complementary examples thereof.

An aspect of the present disclosure provides an example of a super junction semiconductor device that is capable of decreasing resistance against current flowing in a drift region by reducing the extension of a depletion region that occurs in the drift region near a drain region.

According to an example of super junction semiconductor devices according to the present disclosure, in the event that an n-type material is additionally implanted to a lower end of a p-type pillar region, as a depletion region is reduced in size, drain and source resistance (Rds/on) of a drain current flowing at the time of turning on the device can be decreased, and an area or a length of the p-type pillar region is formed to be smaller than those of other portions at an upper end to further reduce the drain and source resistance (Rds/on).

Further, due to the increased quantity of n-type charge of the unit cell, in order to balance the quantity of charges, only the ion dose amount to the corresponding region is increased, and thus a p-type concentration at the lower end is higher than those at the other portions. Accordingly, a critical electric field of a breakdown voltage of the device is formed at the lower end of the p-type pillar region. As a result, it is possible to obtain a stable breakdown waveform and to considerably increase an internal pressure of the device with respect to reverse current.

However, the present disclosure embraces various modifications and various embodiments. Among them, certain examples will now be described in detail in connection with the detailed description and the accompanying drawings.

In general, in order to turn on a super junction semiconductor device, a reverse voltage is applied to a drain region. A depletion layer extends in a portion where a p/n junction is created by the applied reverse voltage. Accordingly, when drain current flows toward a source, the depletion layer is not removed. Thus, in the present disclosure, in order to secure a large non-depletion region where the current flows, even though regions where the depletion layers extend are allowed to be small or the extended regions are allowed to be the same, the non-depletion region is widely formed at first to allow the current to easily flow, so that it is possible to reduce drain and source resistance (Rds/on). Furthermore, the two methods may be simultaneously applied, and an optimum condition for balancing the quantity of n-type charges and the quantity of p-type charges so as to form a critical electric field at the lower end of the p-type pillar in the active region may be determined FIG. 1 is a cross-sectional view of an example of a super junction semiconductor device according to the present disclosure.

Referring to FIG. 1, a super junction semiconductor device according to a first example includes gate electrodes 10, source electrodes 11, source regions 12, p-type body regions 13, p-type pillar regions 14, n-type pillar regions 15, drain regions 16, drain electrodes 19, and gate insulating films 17.

The semiconductor device having a super junction structure includes the n-type pillar regions 15 and the p-type pillar regions 14 on the n-type drain region 16 having a high dopant concentration. The n-type pillar regions 15 and the p-type pillar regions 14 are alternately formed in a horizontal direction of the semiconductor device. The n-type pillar region 15 and the p-type pillar regions 14 are respectively regions to which an n-type dopant and a p-type dopant are uniformly implanted. The n-type pillar region 15 and the p-type pillar regions 14 may be referred to as an n-type semiconductor region and a p-type semiconductor region, respectively. Further, the p-type pillar regions 14 are formed in an n-type epitaxial layer (an n-type drift layer) 30, and the p-type pillar regions 14 are formed by columns of stacked p-type ion implantation regions. The n-type pillar regions 15 are regions of the n-type epitaxial layer 30 to which the p-type ions are not implanted. A concentration of the n-type epitaxial layer 30 and a concentration of the n-type pillar region 15 may be the same.

In one example, the quantity of charges (the amount of dopants) between the n-type pillar region and the p-type pillar region are balanced by allowing a doping concentration of a second doping material of the n-type pillar region 15 to be the same as a doping concentration of a first doping material implanted to the p-type pillar region 14. The first doping material may be a p-type doping material, and the second doping material may be an n-type doping material.

Furthermore, in this example, the upper and lower ends of the p-type pillar region 14 in a vertical direction have the same concentration.

Moreover, in this example, the p-type body region 13 is formed on the p-type pillar region 14, and the source region 12 of the first doping material is selectively formed on the p-type body region 13. The p-type body region 13 comes in contact with the p-type pillar region 14 to be electrically connected to the p-type pillar region 14. In addition, because the p-type body region 13 is electrically connected to the source region 12 and the source electrode 11, the p-type pillar region 14 has the same electric potential as that of the source electrode. The gate insulating film 17 is disposed on the source regions 12 and the n-type pillar region 15. A channel region is formed between the source region 12 and the n-type pillar region 15. The gate electrode 10 is formed on the gate insulating film 17, and the source electrode 11 contacts the source region 12 and the p-type body region 13. The n-type pillar region 15 is a part of the n-type epitaxial layer.

Dotted lines are lines representing depletion regions that extend to the n-type region from the p-type regions by p-n junctions. The p-n junctions are created between the p-type pillar regions 14 and the n-type pillar region 15, and the dotted lines represent the depletion regions that extend to the n-type pillar region 15 from two neighboring p-type pillar regions 14. In this example, the concentration of the p-type pillar region 14 has a constant value that does not vary with depth. Arrows represent widths between the depletion regions. For instance, the two arrows along two dotted lines correspond to widths of a region A and a region B, respectively. Since the region A has a broad width in comparison to the region B, a flow of current in the region A is smooth in comparison to the B region. This is because the width of the B region is smaller than that of the A region.

Thus, the width of the n-type pillar region 15 becomes broader closer to the source electrode 11, or becomes broader in an upward direction. This is because the resistance of the n-type pillar region 15 causes a voltage drop. The potential of the p-type pillar region 14 is the potential of the source electrode 11, whereas a potential gradient is generated by the voltage drop in potential of the n-type pillar region 15. For instance, when a voltage of 10 V is applied between the source electrode 11 and the drain electrode 19, an electric field of 10 V is generated at a portion of the semiconductor device close to the drain electrode 19, and an electric field of 5 V is generated at a middle portion. Accordingly, the depletion regions that extend to the n-type epitaxial layer, that is, the n-type pillar region 15, are decreased by the decreased electric field.

When electrons move from the source electrode 11 toward the drain electrode 19, because the electrons pass through the region B having a very narrow width, a higher drain voltage is needed. When a higher drain voltage is applied, since the depletion regions greatly extend to the n-type pillar region 15 from the p-type pillar regions 14 in a horizontal direction, the n-type pillar region 15 almost becomes the depletion region, which may result in pinch-off. As a result, device performance may be determined by the pinch-off. When the pinch-off is caused, drain current is saturated, so that current density is not increased.

Figure 2A:
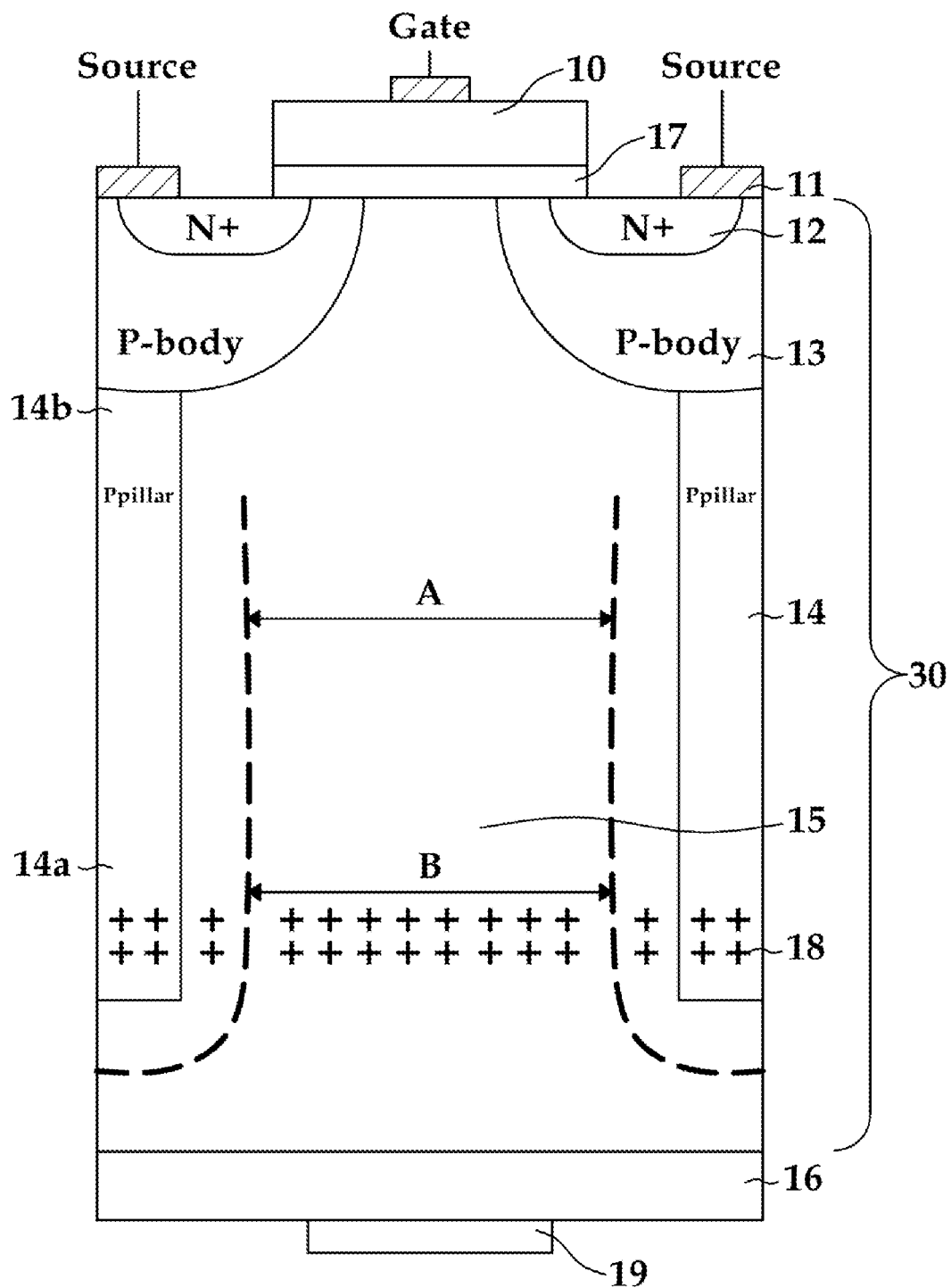
FIG. 2A illustrates a cross-sectional view of an example of a super junction semiconductor device according to the present disclosure.

Meanwhile, referring to FIG. 2A, when blanket n-type ion implantation is performed onto lower ends of the p-type pillar region 14 and the n-type pillar region 15 on the drain region 16, the above-described pinch-off is prevented, so that it is possible to secure high current density. An n-type dopant material is implanted to the lower ends (first regions 14a) of the p-type pillar region 14 and the n-type pillar region 15. In the following description, the implanted region is referred to as a junction field effect transistor ion implantation (JFET IMP) region.

An n-type doping concentration is increased in a bottom region of the n-type pillar region 15, whereas a p-type doping concentration in a bottom region of the p-type pillar region 14 is locally decreased through counter-doping by the JFET ion implantation. Although the same initial ion dose amount as that of an upper end of the p-type pillar region 14 is implanted to the bottom region thereof, compensation through the counter-doping by the n-type JFET ion implantation is performed, so that a net p-type doping concentration of the lower end is relatively lower than the net doping concentration of the upper end. By doing this, the depletion regions are little extended to the n-type pillar region 15 from the p-type pillar regions 14 in the aforementioned reverse bias state (a turned-off state). Accordingly, a depletion layer by a reverse bias in the turned-on state is difficult to extend in the lower end.

Accordingly, a path through which current flows is widened by the decreased depletion layer, so that it is possible to decrease drain and source resistance (Rds/on). Furthermore, the pinch-off can be prevented, so that it is possible to secure higher current density. Even though p-type ions are diffused in a center of the n-type pillar region 15, the concentration decreases as it is closer to the center of the n-type pillar region 15, so that even higher n-type doping concentration can be obtained as compared to a case where the JFET ion implantation is not performed. As a result, it is possible to further decrease the resistance.

Moreover, when the n-type material is implanted to the n-type pillar region 15, since a reverse capacitance value $C_{gd}$ between the gate and drain electrodes is increased, it is possible to exhibit an advantage of being insensitive to oscillation of the device or EMI.

In addition, when the n-type doping material is implanted to the first region 14a of the lower end of the p-type pillar region 14, in order to balance the same quantity of charge, the p-type ion dose amount is further increased by the same quantity of charge, so that the p-type doping concentration of the p-type pillar region 14 may be increased. By doing this, the quantity of charges between the p-type pillar region 14 and the n-type pillar region 15 is balanced by increasing the p-type concentration by the increased n-type concentration by the JFET ion implantation. However, the p-type ion implantation for securing higher concentration of the p-type pillar region 14 may not be performed. Whether or not either the quantity of charges is balanced or the quantity of charges is not balanced may be determined depending on the device performance.

The JFET ion implantation to the p-type pillar region may be performed without using a certain mask, or ion implantation may be performed on only the n-type pillar region 15 by using a certain mask. When the mask is not used, since the number of processes is reduced, there is an advantage of cost reduction. Accordingly, it is preferable to perform the blanket ion implantation without using the mask.

In an example according to the present disclosure, the n-type material can be implanted to the upper end of the p-type pillar region 14. However, as the breakdown voltage is further decreased in comparison to a device in which the JFET ion implantation is performed at the lower end of the p-type pillar region 14, in an example, the JFET ion implantation is performed at the lower end of the p-type pillar region 14.

Figure 2B:
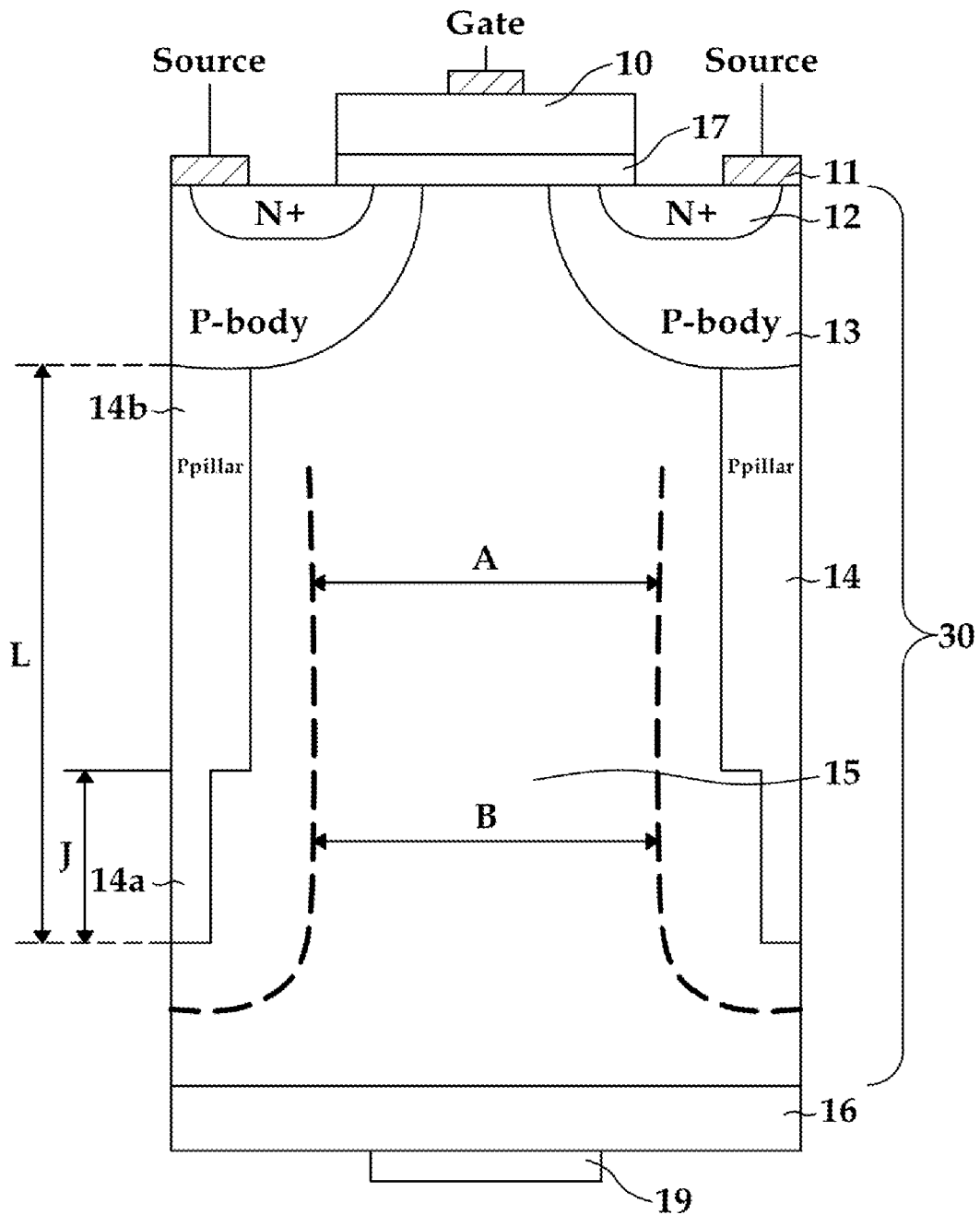
FIG. 2B illustrates a cross-sectional view of another example of a super junction semiconductor device.

FIG. 2B is a diagram illustrating an example of a super junction semiconductor device according to another example.

In order to reduce the extension of the depletion regions to the n-type pillar region 15 from the p-type pillar regions 14 in the horizontal direction, an area of the first region 14a at the lower end of the p-type pillar region 14 is set to be smaller than that of a second region 14b at the upper end of the p-type pillar region 14. That is, in this example, the first region 14a at the lower end of the p-type pillar region 14 have a shorter horizontal length than a horizontal length of the second region 14b at the upper end of the p-type pillar region 14. In one example, the lower end of the p-type pillar region 14 having the shorter horizontal length may have a vertical length J that is approximately 50% to 5%, or approximately bottom 30% to 10%, of a vertical length L the p-type pillar region 14 along the vertical. The vertical length J of the lower end of the p-type pillar region 14 ranges below 10 μm. However, the vertical length J of the lower end is not limited thereto.

As mentioned above, in order to prevent the extension of the depletion layer in a region of the n-type pillar region 15 close to the drain region, the first region 14a at the bottom region of the p-type pillar region 14 needs to be narrow instead of additionally performing the JFET ion implantation onto the bottom region. That is, the first region 14a at the lower end of the p-type pillar region 14 may be smaller in area or length (pillar width) than the upper portion or the middle portion.

Even though the depletion layers extend as illustrated in FIG. 1, since the first region 14a at the lower end of the p-type pillar region 14 is reduced, the depletion layer is extended. Accordingly, it is possible to secure a current flow region similar to the upper end of the n-type pillar region 15.

Further, since the upper portion and the middle portion of the p-type pillar region 14, that is, the second region 14b, have the same area, the upper portion and the middle portion of the p-type pillar region have the same concentration. However, when the same amount of ions as that of the upper portion is implanted to the lower portion of the pillar region, that is, the first region 14a, since an area of the first region is decreased, the p-type concentration is locally decreased in the first region 14a at the lower end of the p-type pillar region. Accordingly, in order to balance the quantity of charges between the p-type pillar region 14 and the n-type pillar region 15, that is, in order to allow the p-type pillar regions and the n-type pillar region to have the same quantity of charge, it is possible to implant the high-concentration p-type ions to the lower portion of the p-type pillar region 14. Accordingly, the p-type doping concentration at the lower ends can be higher than that at the upper end. When the p-type concentration at the lower end is increased, since the electric field is increased to the same electric field value as that of other portions, a critical electric field of the breakdown voltage of the device is formed at the lower end of the p-type pillar region 14. Accordingly, stable breakdown voltage can be obtained, so that an internal pressure of the device in a turned-off state is considerably increased. When the quantity of charges is not balanced, the breakdown voltage is slightly decreased. Thus, it is important to balance the quantity of charges.

Figure 2C:
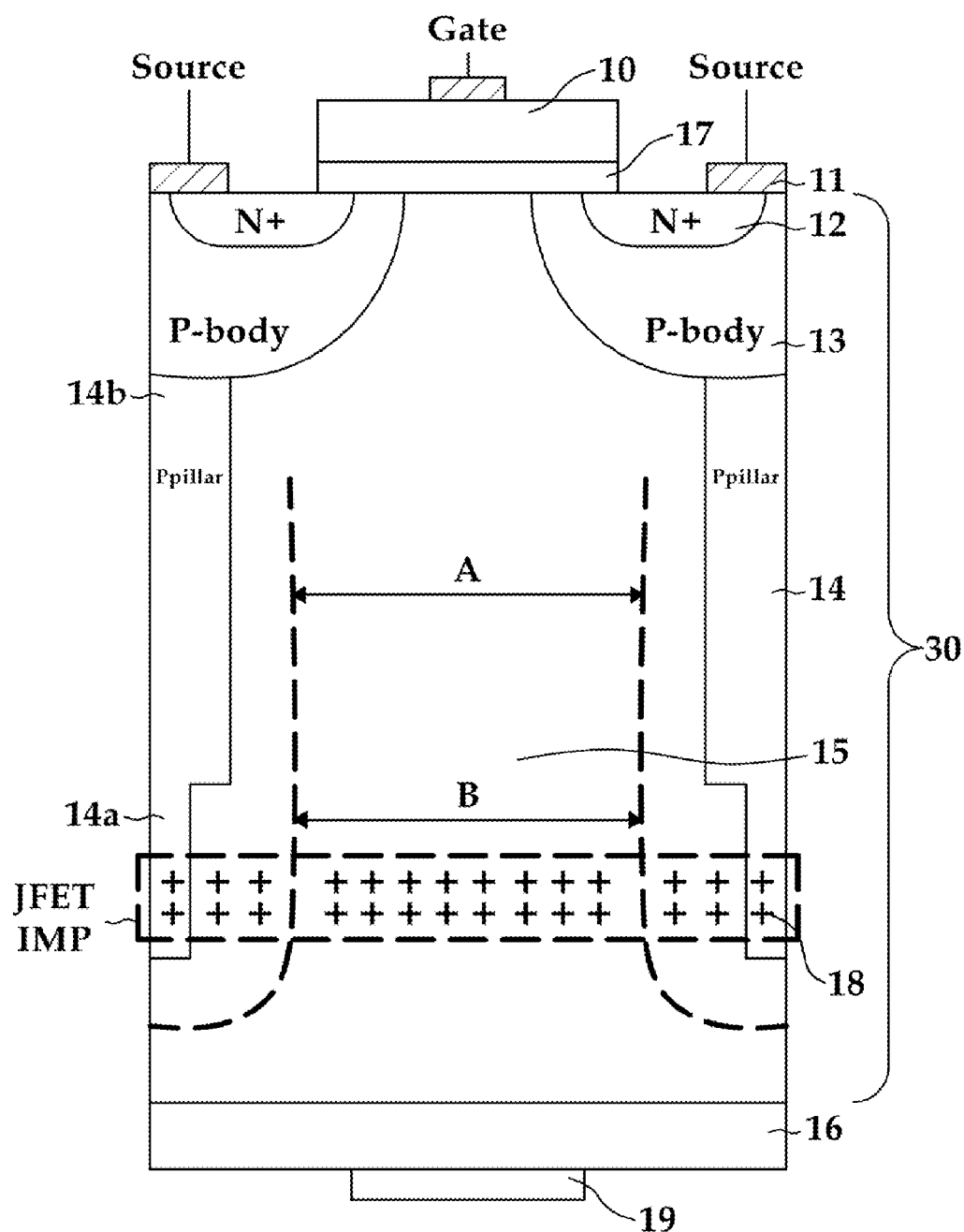
FIG. 2C illustrates a cross-sectional view of another example of a super junction semiconductor device.

FIG. 2C illustrates yet another example that combines features of both the example illustrated in FIG. 2A and the example illustrated in FIG. 2B. That is, a junction field effect transistor ion implantation (JFET IMP) region 18 exists at the lower ends of the p-type pillar region 14 and the n-type pillar region 15, and width of the bottom portion 14a of the p-type pillar region 14 is narrower than those of other portions of the p-type pillar region 14. By doing this, since the aforementioned effects are all exhibited, it is possible to secure a greater amount of current.

As described above, in the present disclosure, when the n-type material is additionally implanted to the lower end of the p-type pillar region 14, the depletion regions is reduced in size. Accordingly, a region in which the drain current flows at the time of turning on the device is further secured, so that drain and source resistance (Rds/on) can be reduced. Further, since the width of the lower end 14a of the p-type pillar region becomes narrower, the diffusion to the n-type pillar region 15 is reduced by the narrowed width. For this reason, it is possible to obtain less drain and source resistance (Rds/on) in the current flow region of the n-type pillar region 15. Accordingly, it is possible to obtain high current density.

Furthermore, since the quantity of n-type charges is increased in a unit cell, the quantity of charges needs to be balanced. For this reason, when the p-type concentration is increased only at the lower ends, since the electric field at the lower end is increased in comparison to other portions, the critical electric field of the breakdown voltage of the device forms at the lower end of the p-type pillar region. As a result, stable breakdown voltage can be obtained in comparison to a device in which the electric field is increased at other portions. Further, the internal pressure of the device in the turned-off state is considerably increased.

The present disclosure is applicable to an epitaxial stack type semiconductor device in which the n-type and p-type pillar regions 15 and 14 are formed while the epitaxial layer 30 is deposited, or to a trench type semiconductor device in which trenches are used to form the n-type and p-type pillar regions 15 and 14.

Figure 3A:
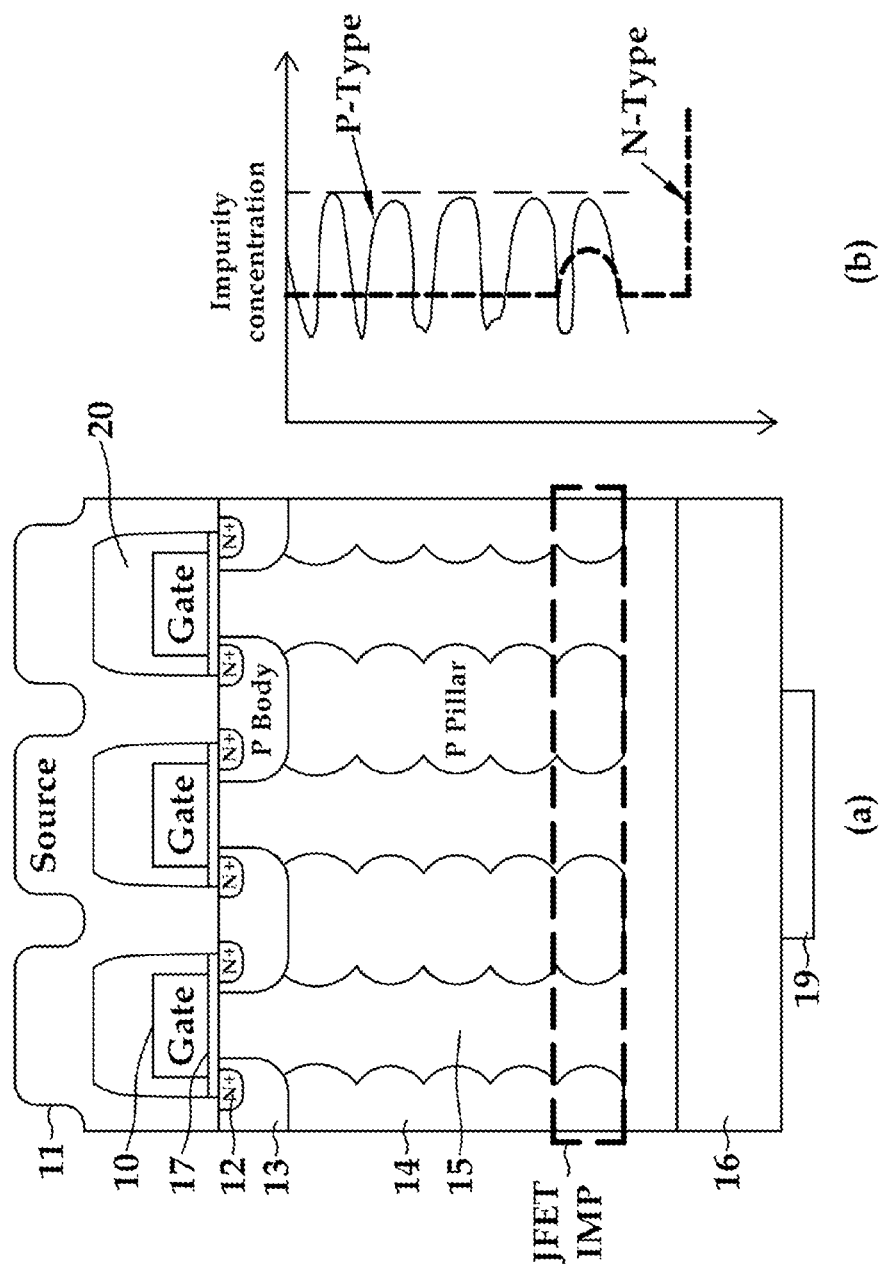
FIG. 3A is a diagram illustrating yet another example of a super junction semiconductor device. In this example, the super junction semiconductor device is a stack type semiconductor device, and a impurity concentration profile thereof is illustrated in the diagram.
Figure 3B:
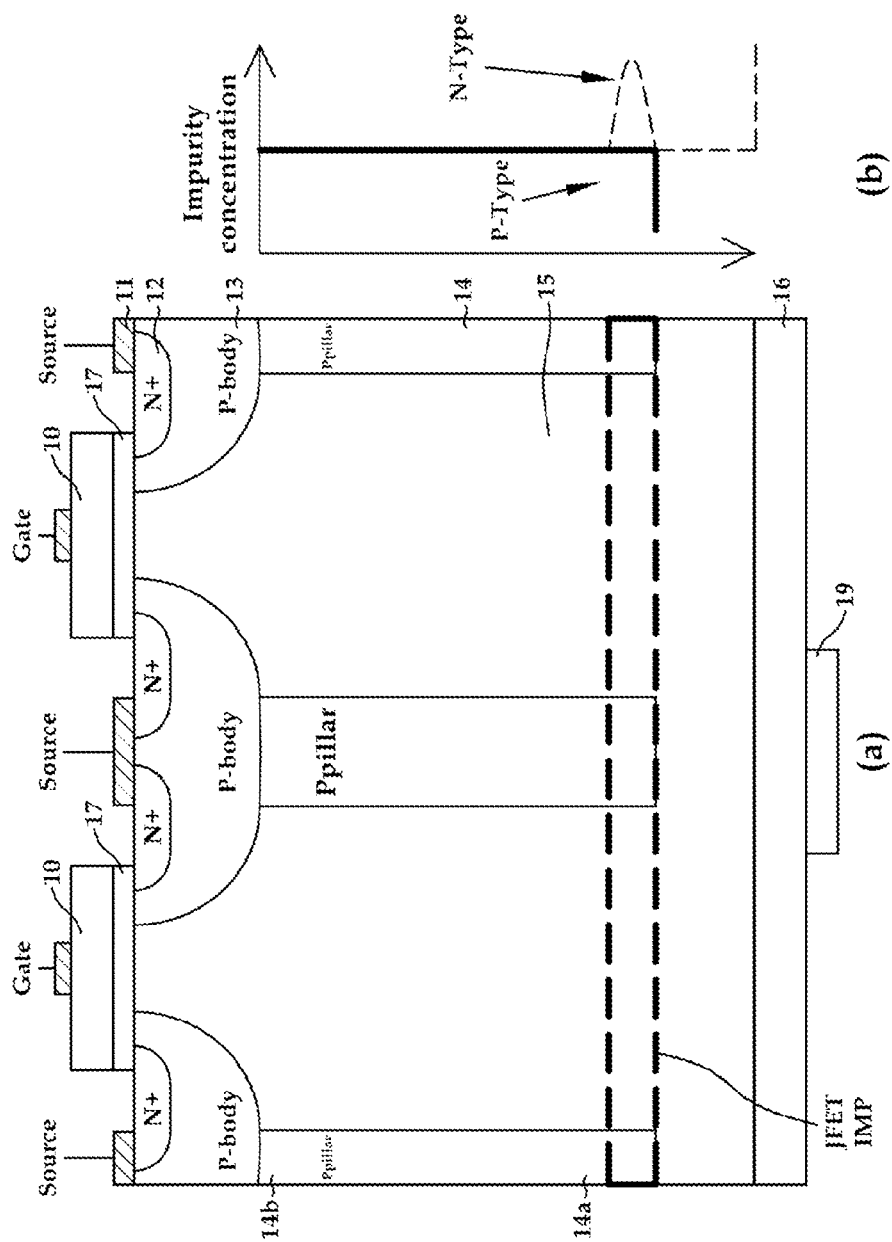
FIG. 3B is a diagram illustrating yet another example of a super junction semiconductor device. In this example, the super junction device is a trench type semiconductor device, and an impurity concentration profile thereof is illustrated in the diagram.

FIGS. 3A and 3B include cross-sectional views exhibiting another example of the super junction semiconductor device. In addition, FIGS. 3A and 3B include diagrams illustrating an example of a stack type semiconductor device, and the n-type and p-type impurity concentration profiles.

Referring to FIG. 3A, in the super junction semiconductor device, a JFET ion implantation is performed onto the lower end of the p-type pillar region 14 and the n-type pillar region 15. When the JFET ion implantation is performed, an n-type concentration of the n-type pillar region 15 in the JFET ion implantation region is increased in comparison to the upper end of the n-type pillar region 15. Meanwhile, a net doping concentration at the lower end of the p-type pillar region 14 is decreased in comparison to the p-type doping concentration at the upper end of the p-type pillar region 14. This is because the JFET ion implantation dopant is counter-doped as an n-type dopant. Since the initial p-type ion implantation concentrations at the upper and lower end are the same, as illustrated in an impurity concentration profile graph (b), the upper and lower ends have the same dopant concentration. However, the n-type dopant is introduced at the lower ends. Thus, if a net doping concentration profile (not illustrated) were obtained, the net doping concentration at the upper end would crease in a descent graph.

The example of trench type super junction semiconductor device illustrated in FIG. 3B is similar to an epitaxial stack type semiconductor device. Thus, repetitive description has been omitted for conciseness.

Figure 4:
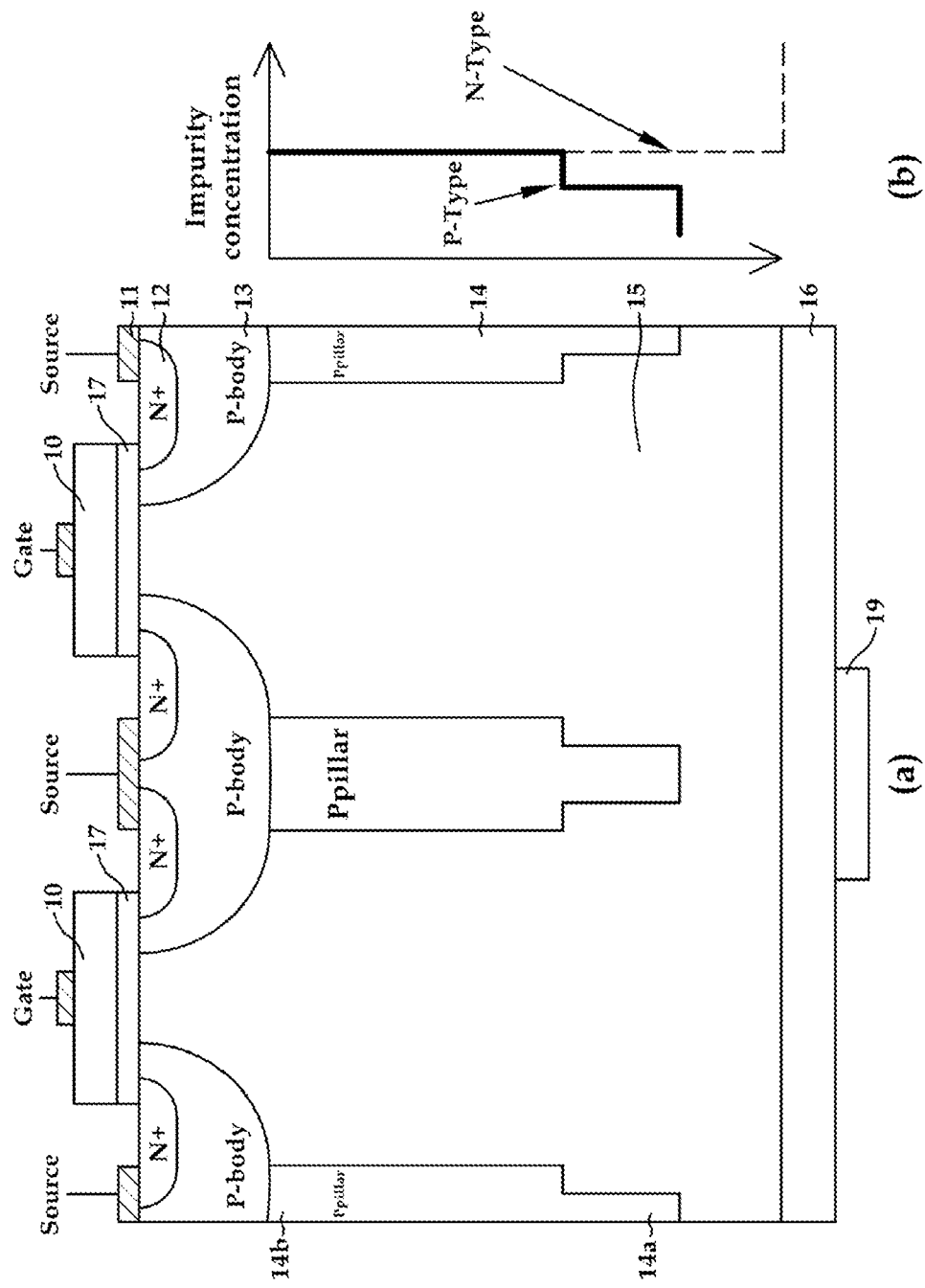
FIG. 4 illustrates a cross-sectional view of yet another example of a super junction semiconductor device and an impurity concentration profile thereof.

Further, in the semiconductor device illustrated in FIG. 4, a width or a cross-sectional area of the endmost region of the p-type pillar region 14 (the first region 14a) is smaller in comparison to the upper region of the p-type pillar region 14. Accordingly, referring to a concentration profile graph (b), the p-type concentration is decreased, whereas the n-type concentration is constant. By doing this, the extension of the depletion regions to the n-type pillar region 15 can be reduced. In this example, in order to balance the quantity of charges, the p-type concentration at the endmost region can be intentionally further increased. When the quantity of charges between the n-type and p-type regions is balanced, it is possible to prevent the reduction of the breakdown voltage. By doing this, the n-type and p-type doping concentration profiles can have the same concentration (not illustrated).

Figure 5:
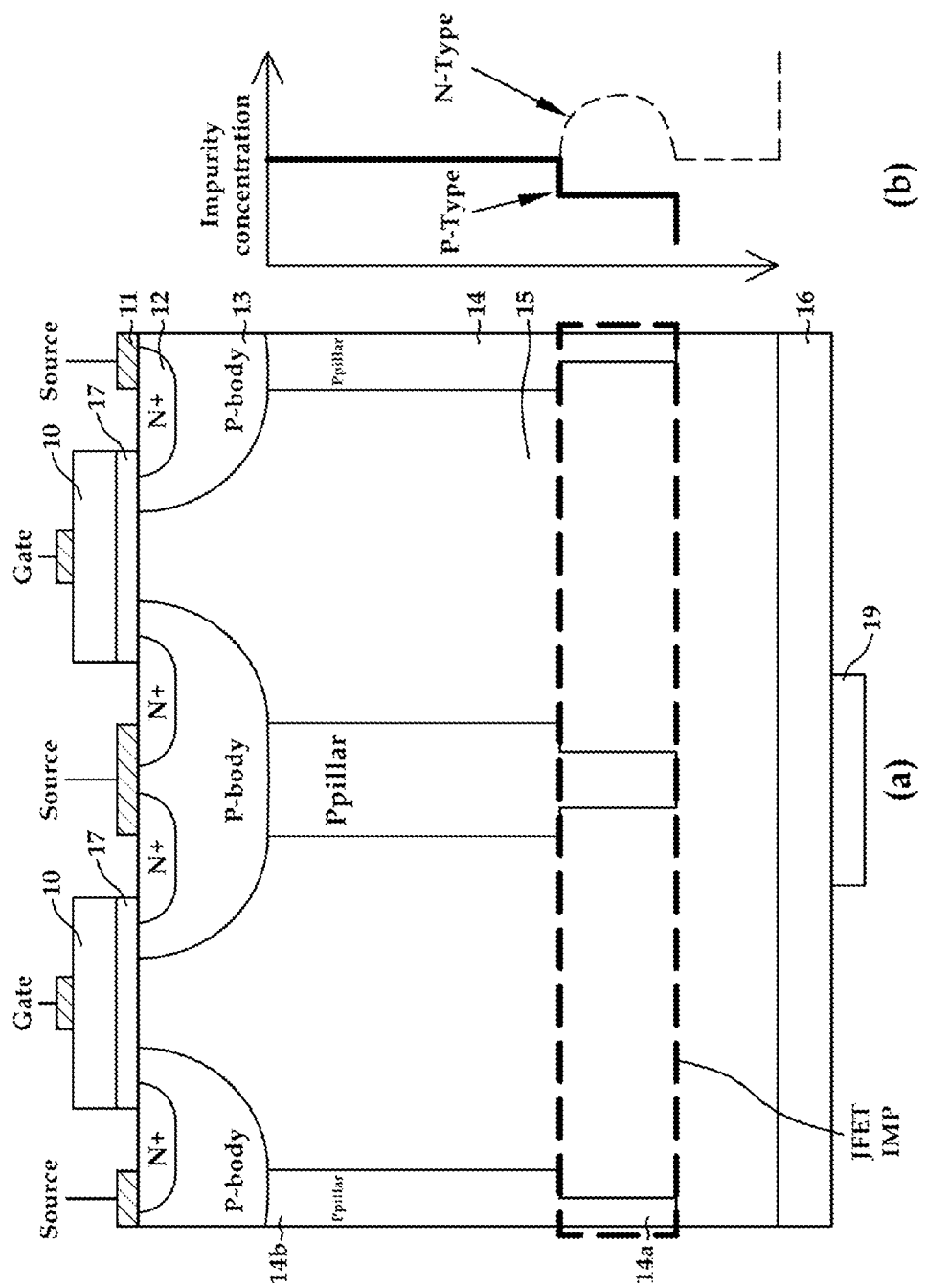
FIG. 5 illustrates a cross-sectional view of another example of a super junction semiconductor device and an impurity concentration profile thereof.

FIG. 5 is a diagram illustrating an example of a semiconductor device in which a width or a cross-sectional area of the endmost region 14a of the p-type pillar region 14 is decreased while performing the JFET ion implantation. The n-type concentration is increased by the n-type JFET ion implantation, and the p-type concentration of the p-type pillar region 14 is decreased as a whole since an area of the ion implantation is decreased. However, in order to balance the quantity of charges as mentioned above, the p-type concentration at the endmost region can be further increased. When the p-type concentration is further increased, the p-type concentration needs to be compensated by the increased n-type concentration. In this example, although the electric field may be greatly increased, it is more advantageous to increase the p-type concentration at the endmost region in comparison to a device in which the electric field at other regions is increased. Since electric fields of regions near the n-type drain electrode are high, the electric fields are offset, so that it is possible to secure stable breakdown voltage.

FIGS. 6A to 6D are cross-sectional views illustrating an example of a method for manufacturing a super junction semiconductor device according to FIG. 3A.

Figure 6A:
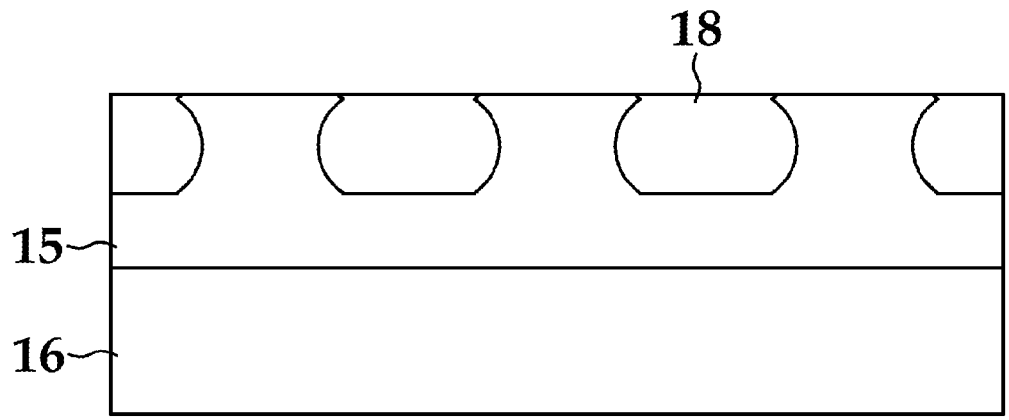
FIGS. 6A to 6D illustrate cross-sectional for describing an example of a method for manufacturing the super junction semiconductor device according to FIG. 3A.
Figure 6B:
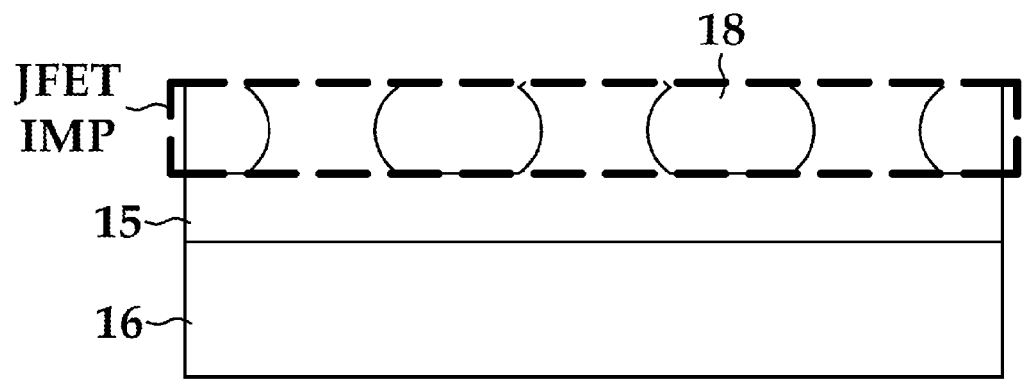
Figure 6C:
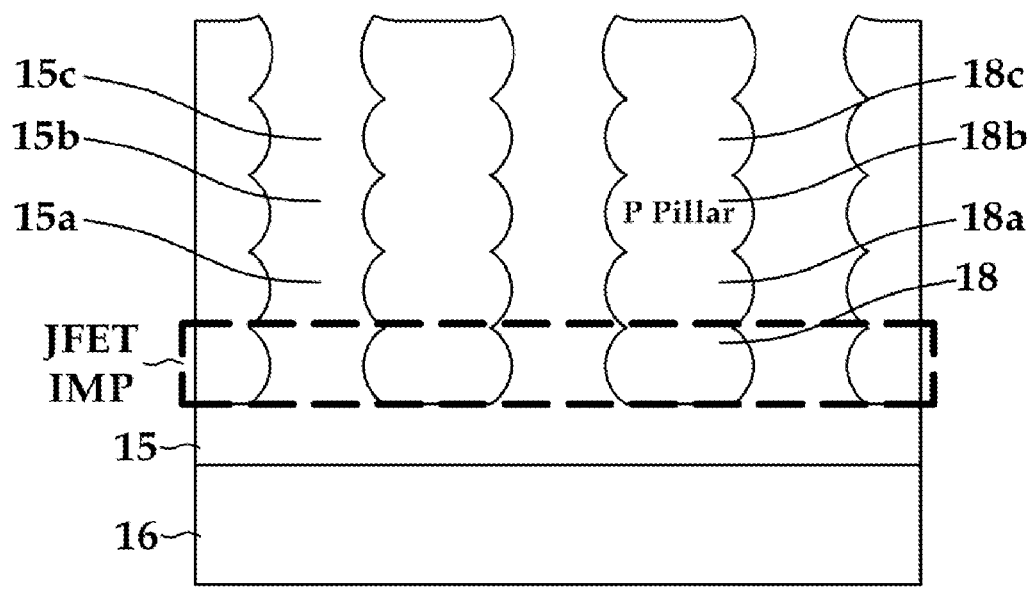

Referring to FIG. 6A, the method for manufacturing the super junction semiconductor device involves growing a n-type first epitaxial layer 15 on a N+ substrate on which a drain region 16 is formed. In this example, the drain region 16 has a greater dopant concentration than the n-type first epitaxial layer. Thereafter, a first p-type pillar region 18 is formed with a p-type dopant by using a mask in the n-type first epitaxial layer. When the mask is removed, ions are implanted to the entire surface by using an n-type dopant such as arsenic (As) or phosphorous (P) in order to form a JFET ion implantation region, as illustrated in FIG. 6B. Subsequently, a second epitaxial layer 15a is grown as illustrated in FIG. 6C, and a second p-type pillar region 18a is formed. Thereafter, third, fourth, and fifth pillar region 18b, 18c, 15b and 15c are formed. Subsequently, in order to diffuse the n-type and p-type dopants, an annealing process may be performed at a high temperature.

Figure 6D:
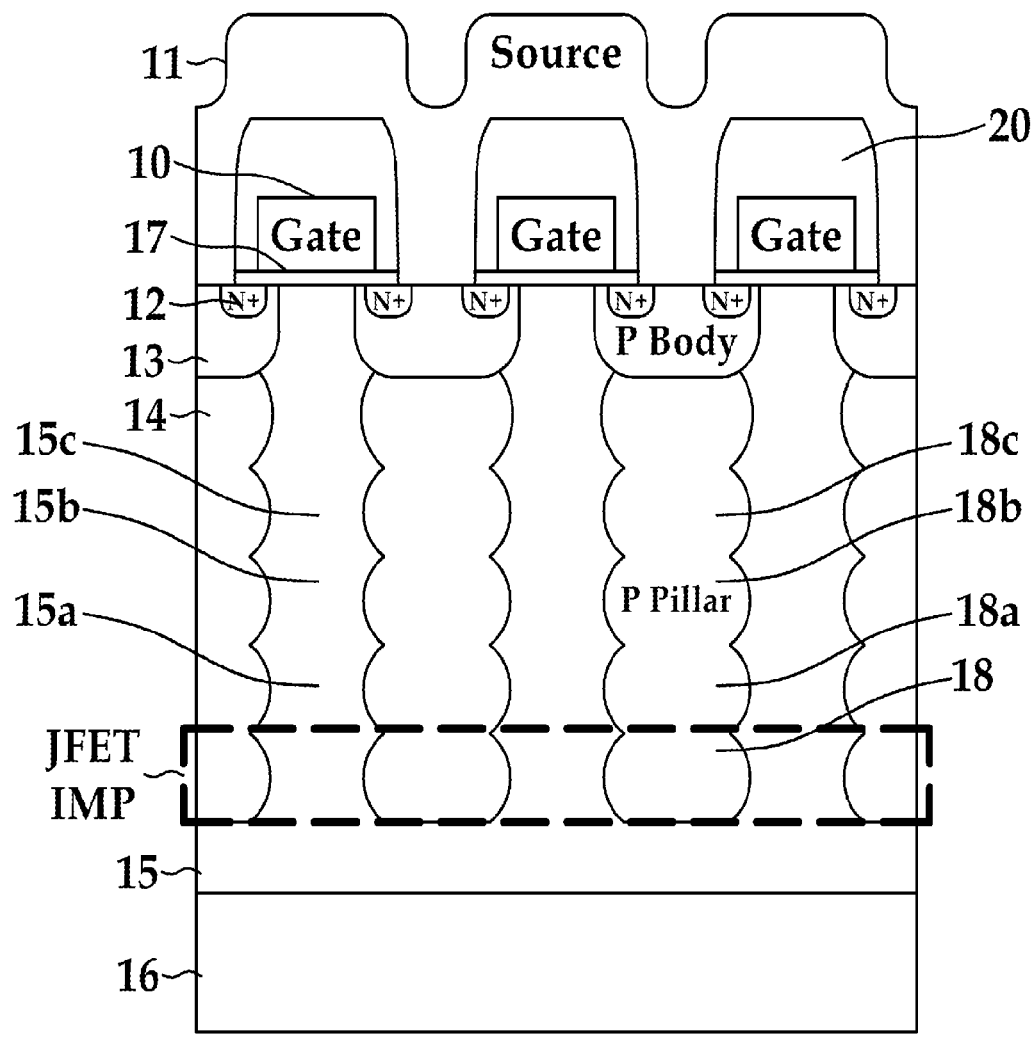

Thereafter, a MOSFET is formed as illustrated in FIG. 6D. A gate insulating film 17 and a gate electrode 10 are sequentially formed, and ions for forming a p-type body region 13 and ions for forming a source region are implanted. Subsequently, an annealing process is performed to diffuse the n-type and p-type dopants of the p-type body region 13 and the source region 12. Thereafter, an interlayer insulating film 20 is formed, and a part of the interlayer insulating film is etched to form the source electrode 11 for connecting the source region 12 and the p-type body region 13.

Figure 7A:
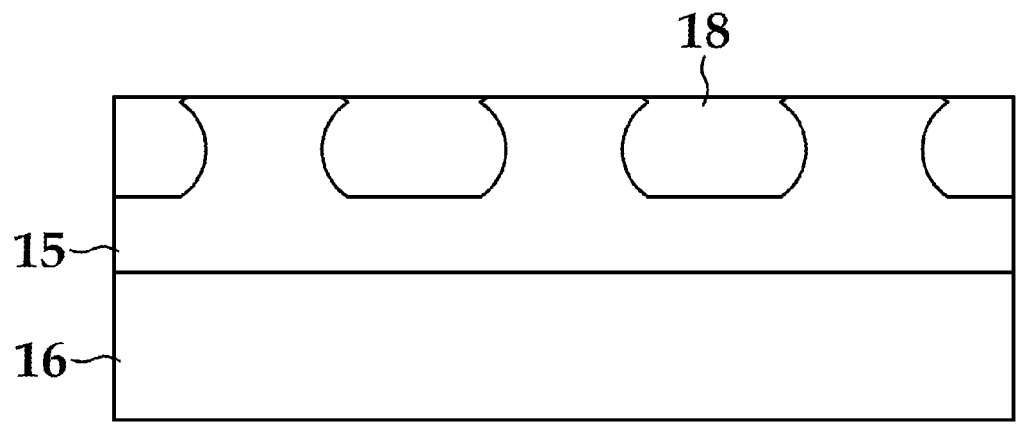
FIGS. 7A to 7C illustrate cross-sectional for describing an example of a method for manufacturing the super junction semiconductor device according to FIG. 4.
Figure 7B:
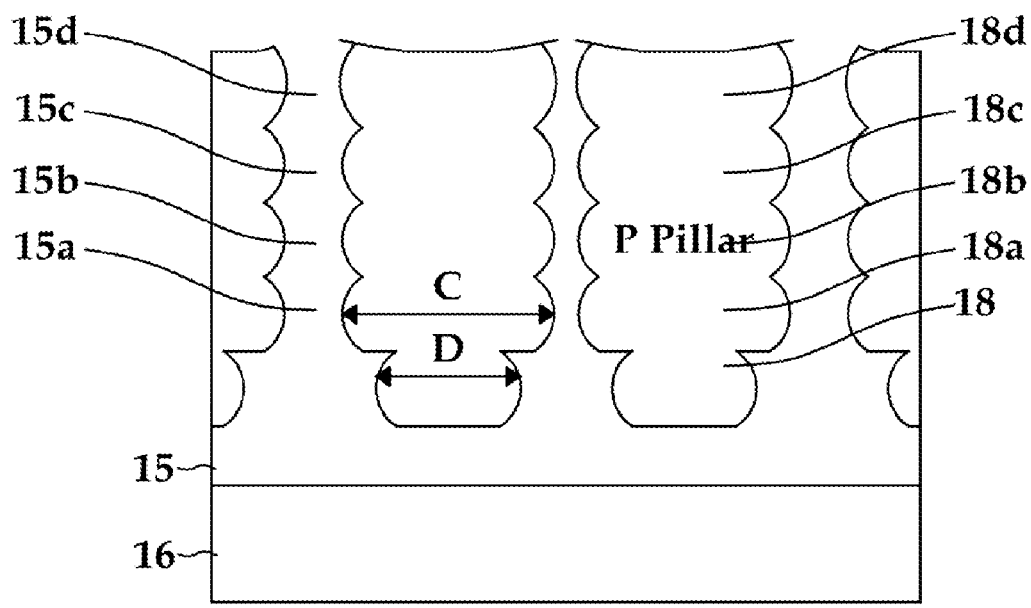
Figure 7C:
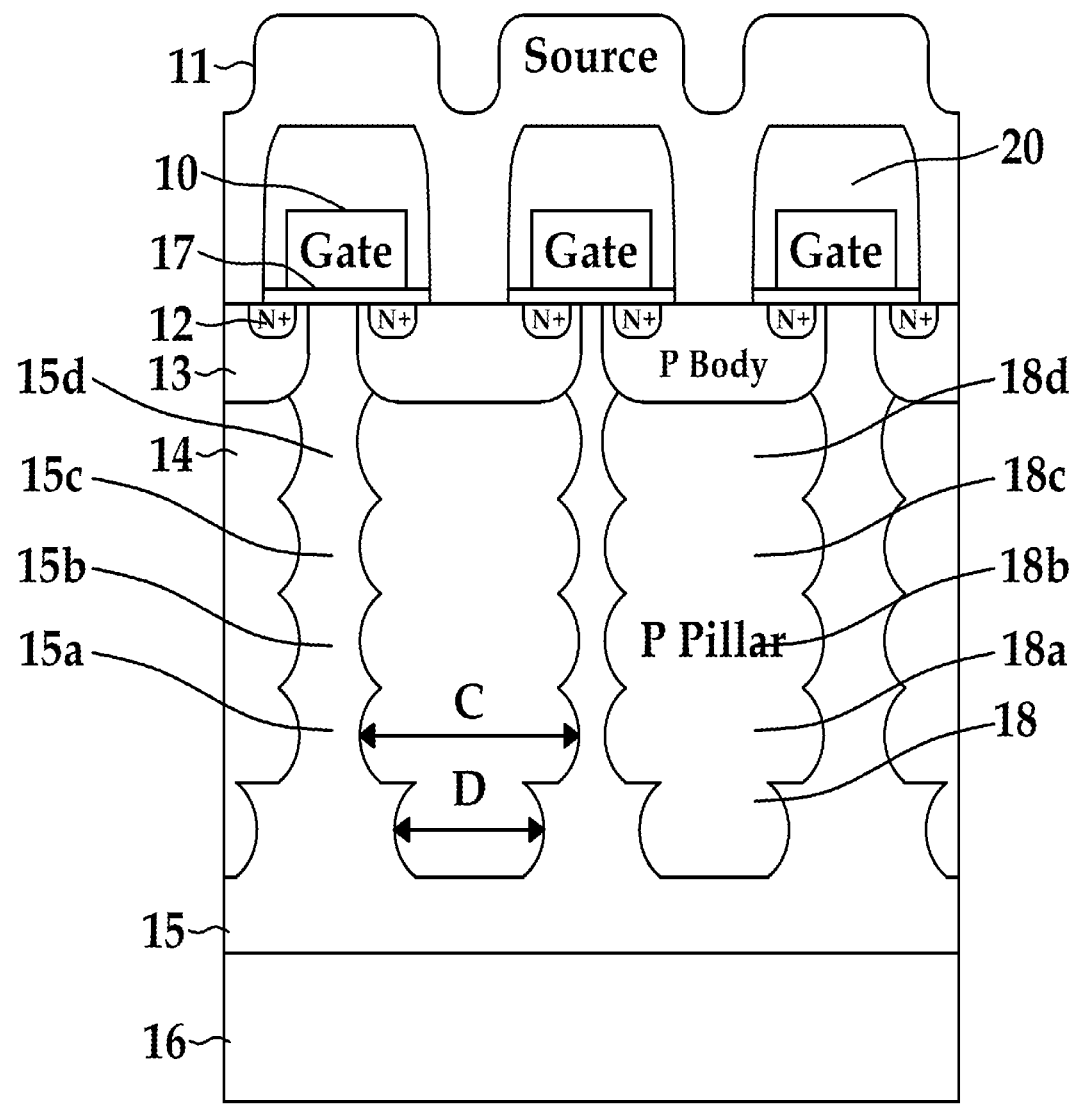

FIGS. 7A to 7C are cross-sectional views illustrating another example of a method for manufacturing a super junction semiconductor device. The super junction semiconductor device obtained may correspond to the semiconductor device illustrated in FIG. 4.

Referring to the drawings, the method for manufacturing a super junction semiconductor device according to FIG. 4 illustrated in FIGS. 7A to 7C is similar to the method described with reference to FIGS. 6A to 6C. Thus, repetitive descriptions are omitted for conciseness. Referring to FIG. 7A, an n-type (n- or n) first epitaxial layer 15 of a low concentration is grown on an n-type (N+) substrate of a high concentration on which a drain region 16 is formed. Thereafter, a first p-type pillar region 18 is formed with a p-type dopant by using a mask. Subsequently, a second epitaxial layer 15a is grown, and a second p-type pillar region 18a is formed. The second p-type pillar region 18a is formed to have a maximum width C is wider than a maximum width D or an area of the first pillar region 18. Thereafter, third, fourth, and fifth pillar regions 18b, 18c and 18d having areas or widths similar to that of the second pillar region 18a are formed. Subsequently, an annealing may be performed at a high temperature to diffuse the n-type and p-type dopants. A manufacturing process of FIG. 7C is similar to the manufacturing process of FIG. 6C, and the width of the first pillar region 18 is narrower than the widths of the second to fifth pillar region 18a to 18d.

Figure 8A:
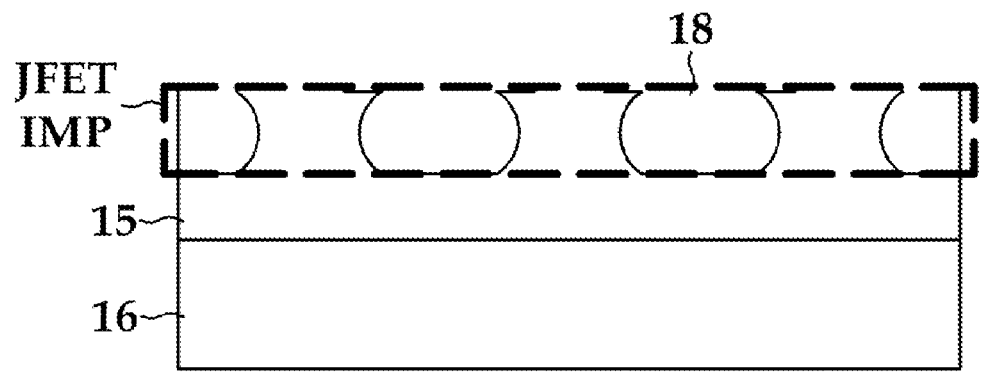
FIGS. 8A to 8C illustrate cross-sectional for describing an example of a method for manufacturing the super junction semiconductor device according to FIG. 5.
Figure 8B:
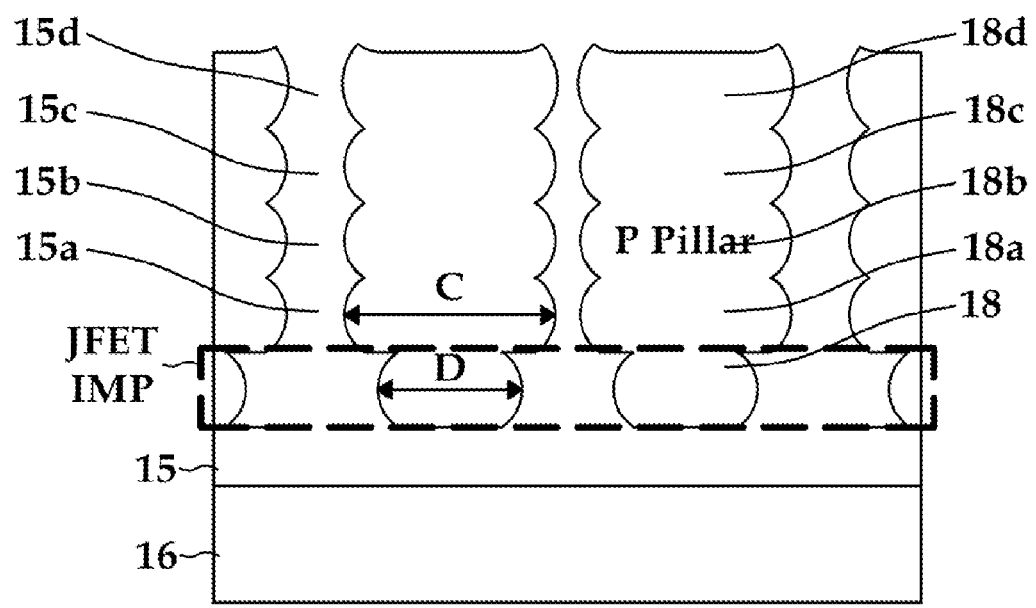
Figure 8C:
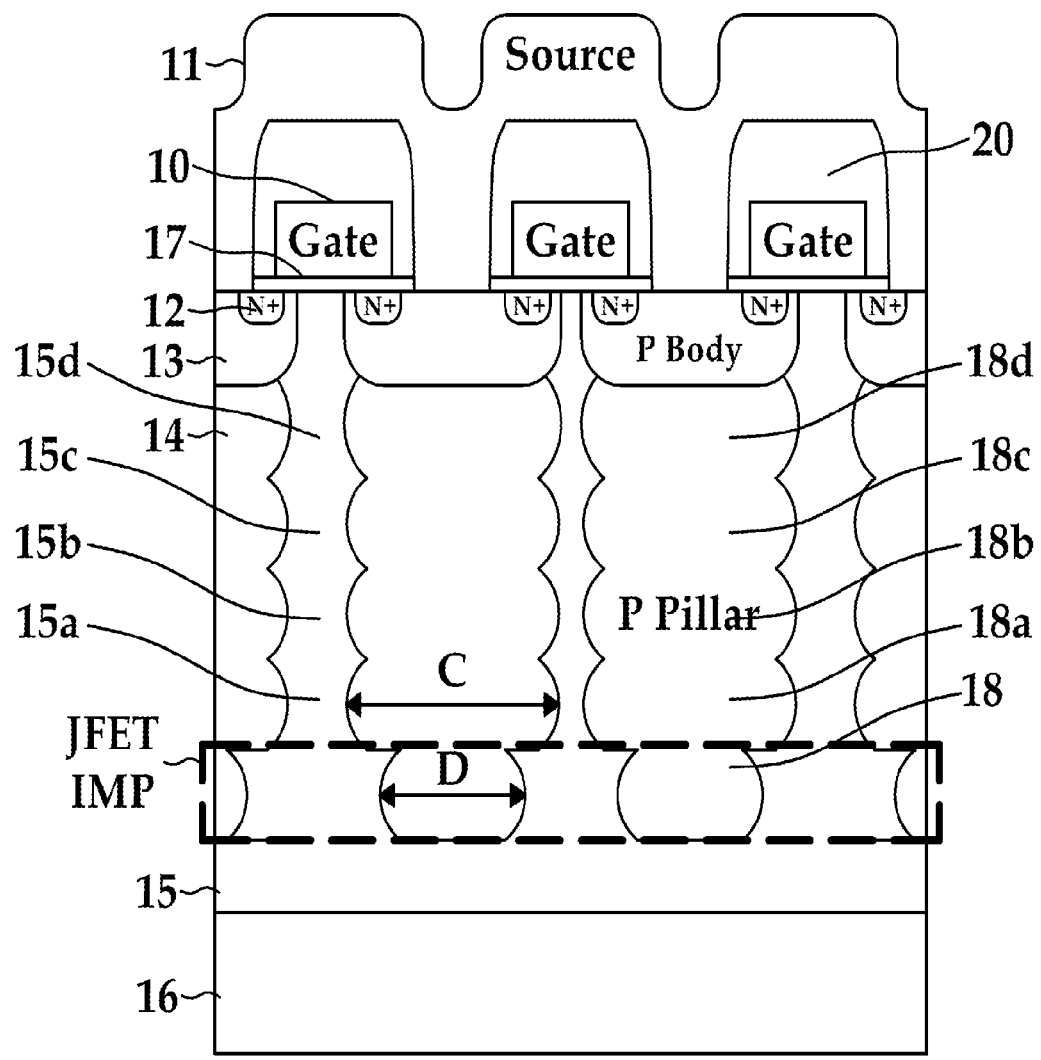

FIGS. 8A to 8C are cross-sectional views illustrating another example of a method for manufacturing a super junction semiconductor device according to FIG. 5.

Referring to FIG. 8A, a first epitaxial layer 15 is grown on an n-type semiconductor substrate 16. Thereafter, a first p-type pillar region 18 is formed with a p-type dopant by using a mask. When ions are implanted using the mask, an area/size C of the first pillar region 18 needs to be defined such that the first pillar region is opened to have the area/size smaller than an area/size D of a second pillar region 18a to be described below. Subsequently, the mask for forming the first p-type pillar region 18 is removed, and ions are implanted onto the entire surface with an n-type dopant to form a JFET ion implantation region. Thereafter, a second epitaxial layer 15a is grown as illustrated in FIG. 8B, and a second p-type pillar region 18a is formed. Subsequently, third, fourth, and fifth pillar regions 18b, 18c and 18d are formed. Thereafter, an annealing process may be performed at a high temperature to diffuse the n-type and p-type dopant. A manufacturing process of FIG. 8C is similar to the manufacturing process of FIG. 6C or the manufacturing process of FIG. 7C.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of forming a super junction semiconductor device, the method comprising: forming a first epitaxial layer of first conductivity type above a substrate;
    forming first pillar regions of second conductivity type by doping two or more areas of the first epitaxial layer with a second conductivity type dopant; and
    forming an ion implantation region by doping the first pillar regions and the first epitaxial layer with a first conductivity type dopant; and
    forming a second epitaxial layer and second pillar regions above the first epitaxial layer and the first pillar regions.

2. The method of claim 1, wherein one or more additional epitaxial layer and additional pillar regions are formed above the second epitaxial layer and the second pillar regions, such that the first pillar regions, the second pillar regions and the one or more additional pillar regions are aligned to form two or more second conductivity type pillar structures adjacent to a first conductivity type pillar structure,
    the method further comprising forming a body region and source region above the two or more second conductivity type pillar structures.

3. The method of claim 2, further comprising:
    forming a source electrode on the body region and the source region;
    forming a gate electrode between the two or more second conductivity type pillar structures; and
    forming a drain electrode below the substrate.

4. The method of claim 2, wherein a lower end of the second conductivity type pillar structures has a smaller width than an upper end of the second conductivity type pillar structures.

5. The method of claim 4, wherein the lower end of the second conductivity type pillar structures corresponds to a junction field effect (JFET) ion implantation region in which counter-doping is performed.

6. The method of claim 4, wherein counter-doping is not performed on the second pillar regions and the additional pillar regions formed above the second pillar regions.

7. The method of claim 1, wherein a dopant concentration of the first epitaxial layer between the two or more first pillar regions is higher than a net dopant concentration of the two or more first pillar regions after forming the JFET region.

* * * * *